United States Patent
Hanta

(10) Patent No.: US 10,630,281 B2
(45) Date of Patent: Apr. 21, 2020

(54) NOISE REDUCTION UNIT

(71) Applicant: KABUSHIKI KAISHA TOKAI RIKA DENKI SEISAKUSHO, Aichi (JP)

(72) Inventor: Yoshiki Hanta, Aichi (JP)

(73) Assignee: KABUSHIKI KAISHA TOKAI RIKA DENKI SEISAKUSHO, Aichi (JP)

( * ) Notice: Subject to any disclaimer, the term of this patent is extended or adjusted under 35 U.S.C. 154(b) by 18 days.

(21) Appl. No.: 15/996,781

(22) Filed: Jun. 4, 2018

(65) Prior Publication Data

US 2018/0358961 A1 Dec. 13, 2018

(30) Foreign Application Priority Data

Jun. 12, 2017 (JP) .................. 2017-115259

(51) Int. Cl.
| | |
|---|---|
| *H03K 17/16* | (2006.01) |
| *G06F 3/041* | (2006.01) |
| *G06F 3/044* | (2006.01) |
| *H03K 17/96* | (2006.01) |

(52) U.S. Cl.
CPC ............ *H03K 17/16* (2013.01); *G06F 3/044* (2013.01); *G06F 3/0418* (2013.01); *H03K 17/164* (2013.01); *H03K 17/962* (2013.01); *H03K 2217/960725* (2013.01)

(58) Field of Classification Search
CPC ..... G06F 3/044; G06F 3/0418; H03K 17/962; H03K 17/164; H03K 17/16; H03K 2217/960725
See application file for complete search history.

(56) References Cited

U.S. PATENT DOCUMENTS

| | | | | |
|---|---|---|---|---|
| 6,661,239 | B1* | 12/2003 | Ozick ................. | G01D 5/2405 324/658 |
| 8,624,852 | B2 | 1/2014 | Kogo et al. | |
| 2005/0266820 | A1* | 12/2005 | Behzad .................... | H04B 1/30 455/306 |
| 2011/0163766 | A1* | 7/2011 | Geaghan ................ | G06F 3/044 324/678 |

FOREIGN PATENT DOCUMENTS

JP 2011014527 1/2011

* cited by examiner

*Primary Examiner* — Muhammad N Edun
(74) *Attorney, Agent, or Firm* — Greenblum & Bernstein, P.L.C.

(57) ABSTRACT

A noise reduction unit includes a plurality of resistors arranged in parallel in a line connected to a device that is charged and discharged and having different resistance values. The noise reduction unit further includes a resistor switch that switches a resistor connected to the device between the plurality of resistors. When the device is discharged, the resistor switch first connects a first one of the plurality of resistors to the device and then connects a second one of the plurality of resistors to the device. The first resistor has a larger resistance value than the second resistor.

7 Claims, 3 Drawing Sheets

Fig.4 (Comparative Example)
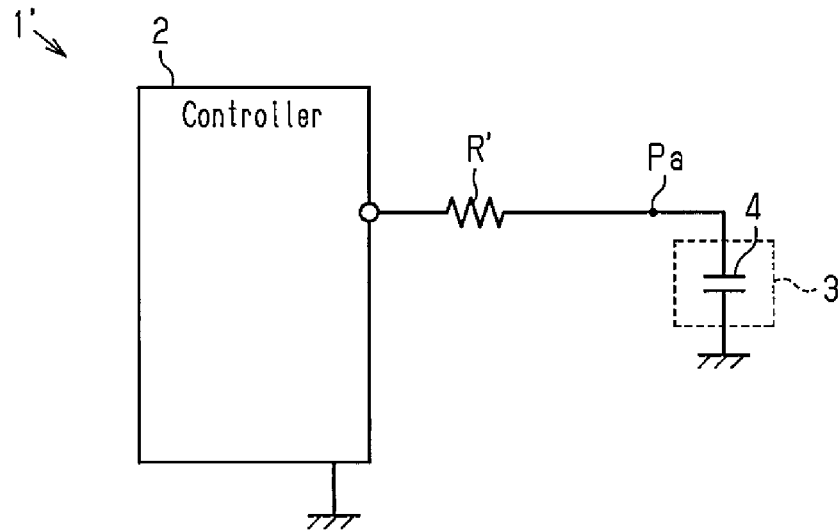
Fig.5 (Comparative Example)
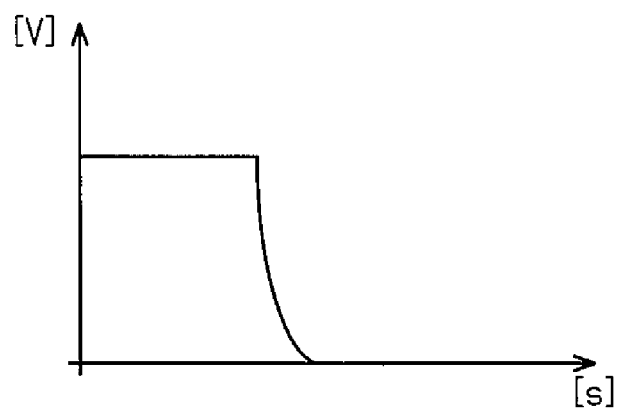
Fig.6
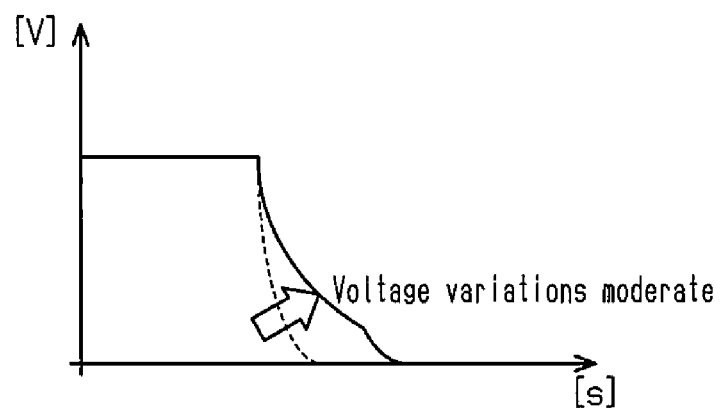

NOISE REDUCTION UNIT

CROSS-REFERENCE TO RELATED APPLICATIONS

This application is based upon and claims the benefit of priority from prior Japanese Patent Application No. 2017-115259, filed on Jun. 12, 2017, the entire contents of which are incorporated herein by reference.

FIELD

This disclosure relates to a noise reduction unit that reduces noise emanated from a device and an electronic device including the noise reduction unit.

BACKGROUND

A capacitive sensor device is one example of a sensor device that is used in a touch panel or a touchpad to detect a touching operation and is known in the prior art (refer to Japanese Laid-Open Patent Publication No. 2011-14527). When a capacitive sensor device is used, a capacitor is charged so that change in its electrostatic capacitance is detectable in accordance with a touching operation. When the sensor device is powered off, the capacitor is discharged so that the potential of the capacitor is reduced to the ground (GND) level.

SUMMARY

If the circuit (line) connected to a device such as a capacitor has a low impedance, when the capacitor is discharged, the electric charge stored in the capacitor quickly flows to ground. Thus, a low impedance circuit is disadvantageous to a reduction in "emission" (i.e., noise emanation) from a device. A high impedance circuit is advantageous to the emission reduction. However, when a high impedance circuit is connected to a controller controlling the device, it is disadvantageous to obtainment of "immunity" (i.e., noise resistance, that is, appropriate operation under noise condition) of an electronic device (e.g., sensor device) including the controller.

One embodiment is a noise reduction unit. The noise reduction unit includes a plurality of resistors arranged in parallel in a line connected to a device that is charged and discharged. The plurality of resistors have different resistance values. The noise reduction unit further includes a resistor switch that switches between the plurality of resistors. When the device is discharged, the resistor switch first connects a first resistor of the plurality of resistors to the device and then connects a second resistor of the plurality of resistors to the device. The first resistor has a resistance value that is larger than that of the second resistor.

Another embodiment is an electronic device. The electronic device includes a device that is charged and discharged, a controller that monitors change in a physical parameter of the device, and the noise reduction unit described above.

Other embodiments and advantages thereof will become apparent from the following description, taken in conjunction with the accompanying drawings, illustrating by way of example the principles of the invention.

It is to be understood that both the foregoing general description and the following detailed description are exemplary and explanatory and are not restrictive of the invention, as claimed.

BRIEF DESCRIPTION OF THE DRAWINGS

The embodiments, together with objects and advantages thereof, may best be understood by reference to the following description of the presently preferred embodiments together with the accompanying drawings in which:

FIG. 4 is a schematic configuration diagram of a sensor device of a comparative example;

FIG. 5 is a graph schematically illustrating change in voltage when the capacitor is discharged in the sensor device illustrated in FIG. 4; and FIG. 6 is a graph schematically illustrating change in voltage when the capacitor is discharged in the sensor device illustrated in FIG. 1.

DESCRIPTION OF THE EMBODIMENTS

Figure 1:
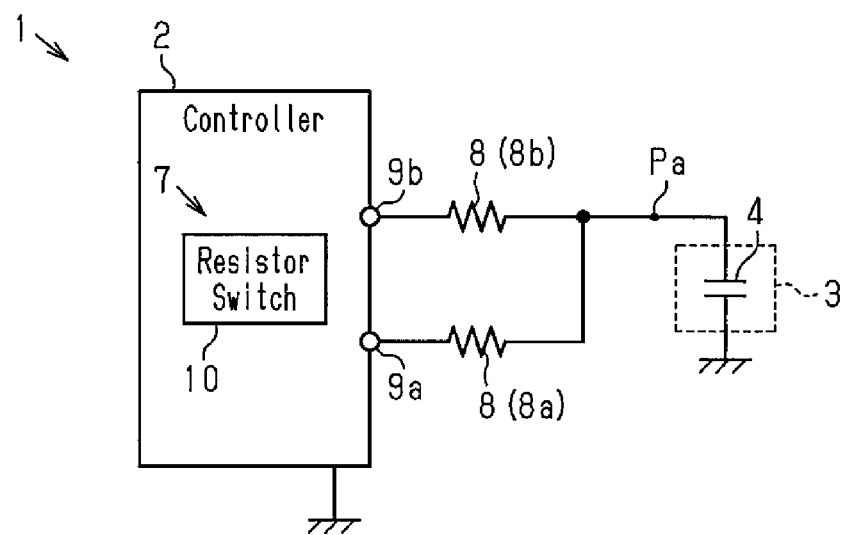
FIG. 1 is a schematic configuration diagram illustrating a sensor device as one example of an electronic device including one embodiment of a noise reduction unit.

Embodiments will now be described with reference to the accompanying drawings. Elements in the drawings may be partially enlarged for simplicity and clarity and thus have not necessarily been drawn to scale. To facilitate understanding, hatching lines may not be illustrated.

One embodiment of a noise reduction unit will now be described with reference to FIGS. 1 to 6.

FIG. 1 illustrates a schematic configuration of a sensor device 1, which is one example of an electronic device. The sensor device 1 includes a controller 2 that controls operation of the sensor device 1 and a device 3 that is charged and discharged. The controller 2 monitors change in physical parameters of the device 3. In one example, which is not restrictive, the device 3 includes capacitors 4, and the controller 2 detects change in the capacitance (electrostatic capacitance) of each capacitor 4. To facilitate understanding, only one of the capacitors 4 is illustrated in the drawings. In the example illustrated in FIG. 1, the sensor device 1 is a capacitive touch sensor device that detects change in the capacitance in accordance with a touch operation performed by the user on an operating surface (not illustrated). The operating surface is, for example, a touch panel. In this case, the user can change a displayed content by directly touching the touch panel, which functions as a display screen. In another example, the operating surface is a touchpad that is provided separately from a display panel and is used to remotely operate the content displayed on the display panel. The capacitors 4 are arranged at a rear side of the operating surface.

The sensor device 1 includes a noise reduction unit 7 that reduces noise emanated from the device 3 (in the present example, capacitor 4) when the device 3 is discharged. The noise reduction unit 7 reduces the "emission" (i.e., noise emanation) from the device 3 and improves the "immunity" (i.e., noise resistance, that is, appropriate operation under noise condition) of the sensor device 1 including the device 3.

The noise reduction unit 7 includes multiple resistors 8 arranged in parallel in a line that connects the device 3 to the controller 2 and having different resistance values. In the present example, the multiple resistors 8 include a first resistor 8a and a second resistor 8b having a smaller resistance value than the first resistor 8a. The controller 2 includes two ports selectively switched to be a use port, namely, a first port 9a and a second port 9b. The first port 9a is connected to the first resistor 8a, and the second port 9b is connected to the second resistor 8b. When the first port 9a is selected as the use port, the first resistor 8a is valid. When the second port 9b is selected as the use port, the second resistor 8b is valid.

The noise reduction unit 7 further includes a resistor switch 10 that switches a resistor (use resistor) connected to the device 3 between the multiple resistors 8 (8a, 8b). When the device 3 (in the present example, capacitor 4) is charged for activation, the resistor switch 10 validates the second resistor 8b having a smaller resistance value. Also, after the charging of the device 3 is completed, while the controller 2 monitors change in the output (in the present example, change in capacitance) of the device 3, the resistor switch 10 validates the second resistor 8b so that the controller 2 monitors change in the output of the device 3 through the second resistor 8b. In the present example, the controller 2 includes the resistor switch 10. When the device 3 is discharged, the resistor switch 10 first connects the first resistor 8a, having a larger resistance value, to the device 3 and then connects the second resistor 8b to the device 3. Preferably, the resistor switch 10 validates the first resistor 8a when the device 3 starts to discharge and validates the second resistor 8b immediately before the discharging is completed.

The operation and advantages of the noise reduction unit 7 will now be described.

Figure 2:
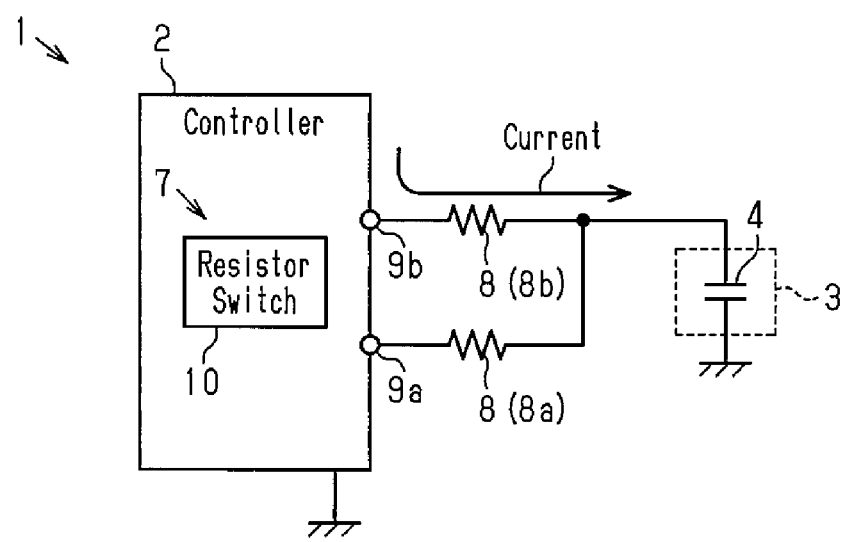
FIG. 2 is a schematic diagram illustrating an operation state when changing a capacitor as one example of a device in the sensor device illustrated in FIG. 1.

As illustrated in FIG. 2, for example, when the sensor device 1 is powered on, the controller 2 starts to charge the capacitor 4 (device 3). The resistor switch 10 selects the second port 9b as the use port to validate the second resistor 8b. As a result, the current from the controller 2 flows through the second resistor 8b, having a smaller resistance value, to the capacitor 4 and changes the capacitor 4. When a sufficient charge is stored in the capacitor 4, change in the capacitance of the capacitor 4 is detectable.

When the charging of the capacitor 4 is completed, the controller 2 shifts to a monitor mode that monitors change in the capacitance of the capacitor 4 (i.e., change in output of device 3). In the monitor mode, the resistor switch 10 maintains the selection of the second port 9b as the use port. Thus, the controller 2 monitors change in the capacitance of the capacitor 4 through the second resistor 8b having a smaller resistance value. When monitoring the capacitance of the capacitor 4, the controller 2 is connected to a current line including the second resistor 8b having a smaller resistance value, that is, a circuit in a low impedance state. This improves the immunity of the sensor device 1 and maintains an appropriate operation (e.g., touch detection) of the sensor device 1.

When the user touches the operating surface such as a touch panel or a touchpad, the capacitance of the capacitor 4 changes at the touched portion. The change in the capacitance of the capacitor 4 changes an analog value (detection value) received by the second port 9b. In the present example, the controller 2 includes an A/D converter (not illustrated) changing an analog value received by the second port 9b into a digital value and detects whether or not a touch operation is performed based on the digital value which changes in accordance with change in capacitance.

Figure 3A:
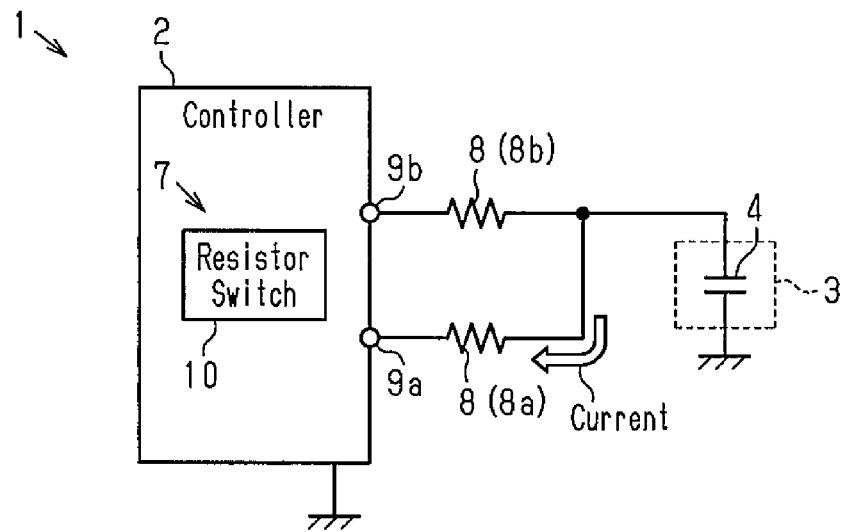
FIGS. 3A and 3B are schematic diagrams illustrating changes in the current line when the capacitor is discharged.

As illustrated in FIG. 3A, for example, when the sensor device 1 is powered off, the controller 2 discharges the capacitor 4 (device 3). The resistor switch 10 selects the first port 9a as the use port to validate the first resistor 8a. As a result, the controller 2 is connected to the capacitor 4 via a current line including the first resistor 8a having a larger resistance value, that is, a circuit in a high impedance state. Thus, during the discharge of the capacitor 4, the current flowing from the capacitor 4 to the controller 2 is limited. When the potential of the capacitor 4 is reduced to the ground (GND) level, the charge of the capacitor 4 will not quickly flow into the controller 2. Thus, the emission is reduced.

Figure 3B:
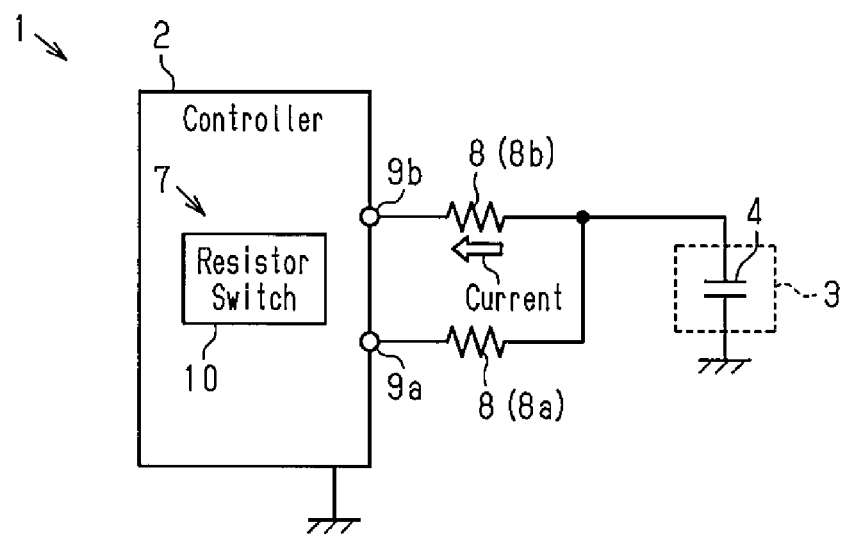

As illustrated in FIG. 3B, when a predetermined time has elapsed from when the capacitor 4 starts to discharge, the resistor switch 10 switches the use port of the controller 2 from the first port 9a to the second port 9b to validate the second resistor 8b. As a result, the controller 2 is connected to the capacitor 4 via the current line including the second resistor 8b having a smaller resistance value, that is, the circuit in the low impedance state. Thus, the remaining charge of the capacitor 4 is swiftly discharged so that the potential of the capacitor 4 is reduced to the GND level.

FIG. 4 illustrates the schematic configuration of a sensor device 1' of a comparative example. In the sensor device 1', a single resistor R' having a small resistance value is connected between the controller 2 and the device 3 (capacitor 4). This is because priority is given to obtainment of the immunity so that the controller 2 correctly detects change in the capacitance of the capacitor 4.

FIG. 5 is a graph schematically illustrating change in voltage when the capacitor 4 is discharged in the sensor device 1'. The graph indicates change in the voltage of a connection point Pa (refer to FIG. 4) between the resistor R' and the capacitor 4. As illustrated in FIG. 4, in the sensor device 1', when the capacitor 4 is discharged, the controller 2 is connected to the capacitor 4 via a circuit in a low impedance state. The potential of the capacitor 4 quickly changes to the GND level. Thus, the voltage quickly changes during a discharge. The configuration illustrated in FIG. 4 is disadvantageous to the emission.

FIG. 6 is a graph schematically illustrating change in voltage when the capacitor 4 is discharged in the sensor device 1. The graph indicates change in the voltage of a connection point Pa (refer to FIG. 1) between the capacitor 4 and the multiple resistors 8. In the present example, as described above, the first resistor 8a is validated when the capacitor 4 starts to discharge. Subsequently, during the discharge (preferably, immediately before discharging is completed), the second resistor 8b is validated. The first resistor 8a has a larger resistance value than the second resistor 8b. Thus, during a discharge, the use resistor is switched from one having a large resistance value to one having a small resistance value. As a result, the voltage slowly changes during a discharge. The configuration illustrated in FIG. 1 is advantageous to the emission. Additionally, during a normal operation (in the present example, during activation of device 3 and in monitor mode monitoring change in output of device 3), the second resistor 8b, having a smaller resistance value, is validated so that the controller 2 is connected to the device 3 via the circuit (line) in the low impedance state. Thus, the configuration illustrated in FIG. 1 is also advantageous to the immunity.

As described above, when the device 3 is discharged, the resistor switch 10 of the noise reduction unit 7 first connects the first resistor 8a, having a larger resistance value than the second resistor 8b, to the device 3 and then connects the second resistor 8b to the device 3. Thus, during the discharge, the current line between the controller 2 and the device 3 is changed from a high impedance state to a low impedance state. This limits a quick flow of current from the device 3 to the controller 2 and moderates the voltage change during a discharge. Thus, the emission is reduced. Additionally, during the normal operation, the controller 2 is connected to the circuit in the low impedance state. Thus, the immunity is improved. Therefore, the noise reduction unit 7 achieves both a reduction in the emission and an improvement in the immunity.

In the present example, the device 3 includes the capacitor 4 arranged to detect change in the capacitance. When the capacitor 4 is discharged, the resistor switch 10 changes the current line (use resistor) between the controller 2 and the capacitor 4 from the high impedance state (first resistor 8a) to the low impedance state (second resistor 8b). This prevents a quick flow of the charge from the capacitor 4 to GND. Accordingly, the potential of the capacitor 4 is slowly decreased to the GND potential. Thus, the emission is reduced during the discharge of the capacitor 4.

Additionally, when the device 3 (in the present example, capacitor 4) is charged for activation, the resistor switch 10 validates the second resistor 8b, having a smaller resistance value. The device 3 (capacitor 4) is efficiently charged by the current flowing through the second resistor 8b. Additionally, when the device 3 (capacitor 4) is charged, the controller 2 is connected to the circuit in the low impedance state. Thus, the immunity is also improved.

Further, when the charging of the device 3 (in the present example, capacitor 4) is completed, while the controller 2 monitors change in the output of the device 3 (change in capacitance of capacitor 4), the resistor switch 10 validates the second resistor 8b, having a smaller resistance value. Thus, the controller 2 monitors change in the output of the device 3 through the second resistor 8b (current line in low impedance state). This limits variations in the output (detection value) of the device 3 detected by the controller 2 that are caused by external factors such as noise. Thus, the immunity is improved when change in the output of the device 3 is monitored.

It should be apparent to those skilled in the art that the foregoing embodiments may be implemented in many other specific forms without departing from the scope of this disclosure. Particularly, it should be understood that the foregoing embodiments may be implemented in the following forms.

The device 3 is not limited to a circuit including the capacitor 4 and may include a different kind of component.

The number of the resistors 8 is not limited to two and may be three or more.

The resistance value of each of the first and second resistors 8a and 8b is not particularly limited. The first resistor 8a only needs to have a larger resistance value than the second resistor 8b.

During a discharge of the device 3, after the resistor is switched from the first resistor 8a to the second resistor 8b, the resistor may be further switched to another resistor 9 that is used in the normal operation (during charge and in monitor mode).

The noise reduction unit 7 is not limited to the use in the capacitive sensor device 1 and may be used in a sensor device using a different detection process.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to an illustration of the superiority and inferiority of the invention. Although embodiments have been described in detail, it should be understood that various changes, substitutions, and alterations could be made hereto without departing from the scope of this disclosure.

The invention claimed is:

1. A noise reduction unit comprising:
   a plurality of resistors arranged in parallel in a line connected to a device that is charged and discharged, wherein the plurality of resistors have different resistance values; and
   a resistor switch that switches between the plurality of resistors such that when the resistor switch is connected to a first resistor of the plurality of resistors, no current flows through a second resistor of the plurality of resistors, and when the resistor switch is connected to the second resistor of the plurality of resistors, no current flows through the first resistor of the plurality of resistors, wherein
   when the device is discharged, the resistor switch first connects the first resistor of the plurality of resistors to the device and then connects the second resistor of the plurality of resistors to the device, and
   the first resistor has a resistance value that is larger than that of the second resistor.

2. The noise reduction unit according to claim 1, wherein the device includes a capacitor arranged to detect change in a capacitance of the capacitor.

3. The noise reduction unit according to claim 1, wherein when the device is charged for activation, the resistor switch validates the second resistor so that the device is charged by a current flowing through the second resistor.

4. The noise reduction unit according to claim 1, wherein
   the resistor switch is included in a controller that monitors change in the output of the device, and
   when charging of the device is completed, the resistor switch validates the second resistor so that the controller monitors change in output of the device through the second resistor.

5. The noise reduction unit according to claim 1, wherein
   the resistor switch connects the first resistor to the device when the device starts to discharge, and
   the resistor switch connects the second resistor to the device immediately before discharging of the device is completed.

6. An electronic device comprising:
   a device that is charged and discharged;
   a controller that monitors change in a physical parameter of the device;
   a plurality of resistors arranged in parallel in a line that connects the device to the controller, wherein the plurality of resistors have different resistance values; and
   a resistor switch that switches between the plurality of resistors such that when the resistor switch is connected to a first resistor of the plurality of resistors, no current flows through a second resistor of the plurality of resistors, and when the resistor switch is connected to the second resistor of the plurality of resistors, no current flows through the first resistor of the plurality of resistors, wherein
   when the device is discharged, the resistor switch first connects the first resistor of the plurality of resistors to the device and then connects the second resistor of the plurality of resistors to the device, and
   the first resistor has a resistance value that is larger than that of the second resistor.

7. The electronic device according to claim 6, wherein
the device includes a capacitor arranged to detect change in a capacitance of the capacitor, and
the electronic device is a touch sensor device.

\* \* \* \* \*